US009231531B2

United States Patent
Tsai et al.

(10) Patent No.: US 9,231,531 B2
(45) Date of Patent: Jan. 5, 2016

(54) COMMUNICATION SYSTEM AND METHOD FOR DETECTING LOADING VARIATION OF POWER AMPLIFIER THEREOF

(71) Applicant: MediaTek Inc., Hsin-Chu (TW)

(72) Inventors: Tsung-Han Tsai, Tainan (TW); Shin-Fu Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 31 days.

(21) Appl. No.: 14/165,777

(22) Filed: Jan. 28, 2014

(65) Prior Publication Data

US 2015/0188499 A1    Jul. 2, 2015

Related U.S. Application Data

(60) Provisional application No. 61/920,837, filed on Dec. 26, 2013.

(51) Int. Cl.
| | | |
|---|---|---|
| *H03F 1/32* | (2006.01) | |
| *H03F 3/24* | (2006.01) | |
| *H04B 1/04* | (2006.01) | |
| *H03F 3/195* | (2006.01) | |

(52) U.S. Cl.
CPC .............. *H03F 1/3247* (2013.01); *H03F 3/195* (2013.01); *H03F 3/24* (2013.01); *H04B 1/0475* (2013.01); *H03F 2200/465* (2013.01); *H03F 2201/3227* (2013.01); *H04B 2001/0425* (2013.01)

(58) Field of Classification Search
None
See application file for complete search history.

(56) References Cited

U.S. PATENT DOCUMENTS

| | | | |
|---|---|---|---|
| 7,042,285 B2 | 5/2006 | Parkhurst et al. | |
| 7,358,807 B2 | 4/2008 | Scuderi et al. | |
| 7,392,021 B2 | 6/2008 | Jain et al. | |
| 7,738,849 B2 | 6/2010 | Frank et al. | |
| 7,761,065 B2 | 7/2010 | Drogi et al. | |
| 8,022,688 B2 | 9/2011 | You | |
| 2007/0184793 A1* | 8/2007 | Drogi et al. | 455/127.1 |
| 2007/0190952 A1* | 8/2007 | Waheed et al. | 455/114.3 |

OTHER PUBLICATIONS

Cusinato, P.; "Gain/Bandwidth Programmable PA Control Loop for GSM/GPRS Quad-Band Cellular Handsets;" IEEE Journal of Solid-State Circuits; vol. 39; No. 6; Jun. 2004; pp. 960-966.

* cited by examiner

*Primary Examiner* — Leon-Viet Nguyen
(74) *Attorney, Agent, or Firm* — McClure, Qualey & Rodack, LLP (57) ABSTRACT

A communication system is provided. The communication system includes an antenna, a power amplifier, a detector and a signal-processing module. The power amplifier provides an output signal to the antenna according to an input signal. The detector provides power information and voltage information according to the output signal. The signal-processing module obtains a loading variation according to the power information and the voltage information, and provides the input signal according to the loading variation. When the loading variation exceeds a threshold value, the signal-processing module performs a digital pre-distortion calibration for the input signal.

18 Claims, 7 Drawing Sheets

COMMUNICATION SYSTEM AND METHOD FOR DETECTING LOADING VARIATION OF POWER AMPLIFIER THEREOF

CROSS REFERENCE TO RELATED APPLICATIONS

This Application claims priority of U.S. Provisional Application No. 61/920,837, filed on Dec. 26, 2013, the entirety of which is incorporated by reference herein.

BACKGROUND OF THE INVENTION

1. Field of the Invention

The invention relates to a communication system, and more particularly, to a method for detecting loading variation of a power amplifier of a communication system.

2. Description of the Related Art

To prolong battery life of mobile handset devices, the power-efficiency demands from wireless mobile communication systems have become more important. Specifically, a transceiver's most power-hungry device is a power amplifier which has nonlinear characteristics. Meanwhile, modulation of non-constant-envelope signals demands high linearity from a power amplifier. As a result, there is a trade off between linearity and power efficiency in a wireless transmitter.

Furthermore, in a radio frequency (RF) transmission of digital information, sampled data sequences are converted to analog signals and processed, subsequently, by various operations containing unwanted nonlinearities. The primary source of nonlinearity is the power amplifier. The nonlinear behavior of the power amplifier (or other devices) can be compensated for using digital pre-distortion (DPD). That is, the correction signal is a sampled sequence applied prior to the power amplifier to create a corrected signal which compensates for nonlinear modes in the transmitter.

BRIEF SUMMARY OF THE INVENTION

A communication system and methods for detecting a loading variation of a power amplifier thereof are provided. An embodiment of a communication system is provided. The communication system comprises: an antenna; a power amplifier, providing an output signal to the antenna according to an input signal; a detector, providing power information and voltage information according to the output signal; and a signal-processing module, obtaining a loading variation according to the power information and the voltage information, and providing the input signal according to the loading variation. When the loading variation exceeds a threshold value, the signal-processing module performs a digital pre-distortion calibration for the input signal.

Furthermore, an embodiment of a method for detecting a loading variation of a power amplifier is provided. A first digital pre-distortion calibration is performed for an input signal of the power amplifier. A first loading impedance of the power amplifier is obtained when the first digital pre-distortion calibration is performed. First power information and first voltage information are obtained according to an output signal of the power amplifier by a detector after the first loading impedance of the power amplifier is obtained. A second loading impedance of the power amplifier is obtained according to the first power information and the first voltage information. A loading variation of the power amplifier is obtained according to the first loading impedance and the second loading impedance.

Moreover, another embodiment of a method for detecting a loading variation of a power amplifier is provided, wherein the power amplifier is implemented in a communication system. A first digital pre-distortion calibration is performed for an input signal of the power amplifier. A first loading impedance of the power amplifier is obtained when the first digital pre-distortion calibration is performed. The transmission status of the communication system is monitored. First power information and first voltage information are obtained according to an output signal of the power amplifier by a detector when the transmission status indicates that transmission performance is worse. A second loading impedance of the power amplifier is obtained according to the first power information and the first voltage information. A loading variation of the power amplifier is obtained according to the first loading impedance and the second loading impedance.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
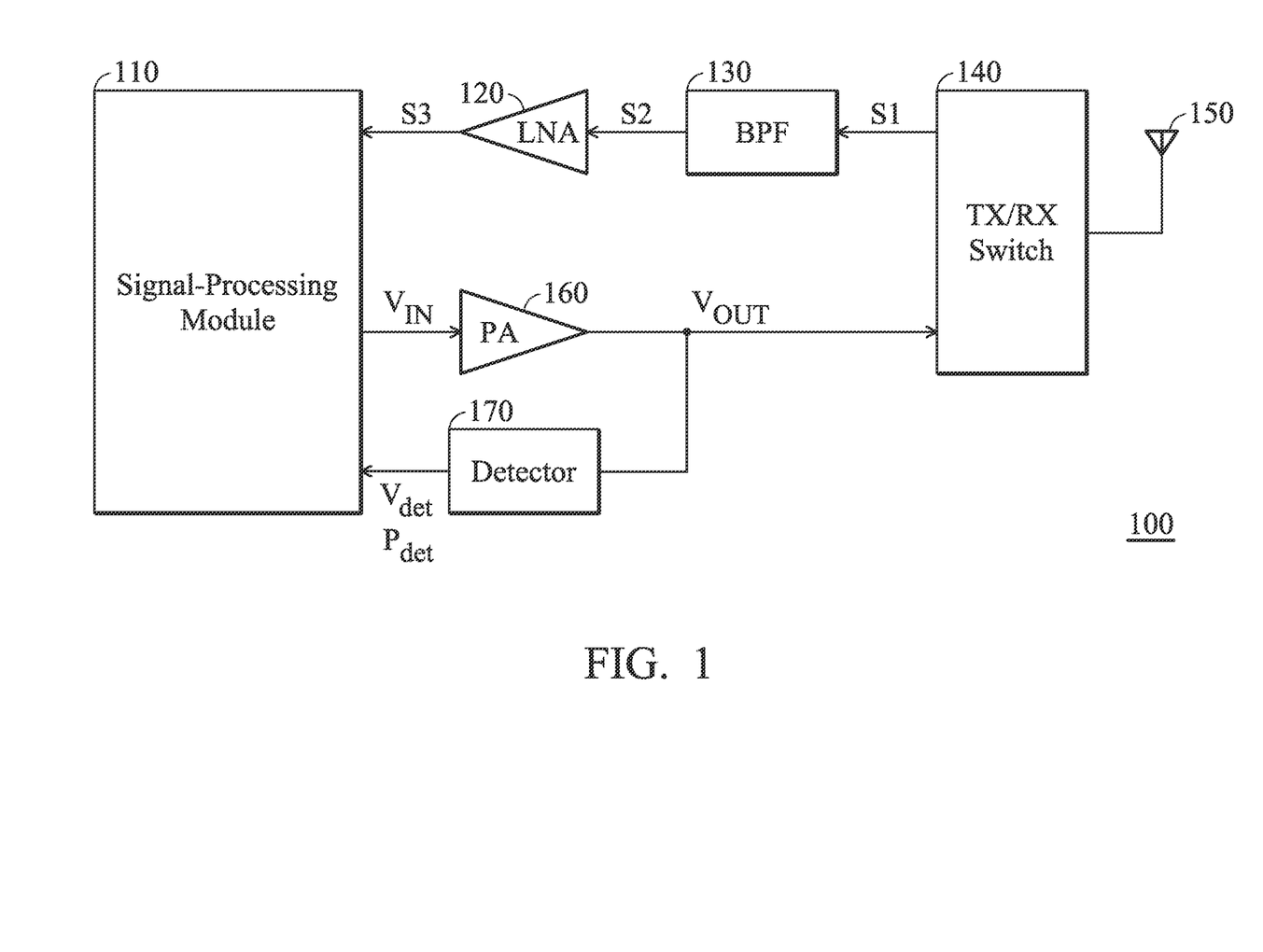
FIG. 1 shows a communication system according to an embodiment of the invention.

FIG. 1 shows a communication system 100 according to an embodiment of the invention. The communication system 100 comprises a signal-processing module 110, a low noise amplifier (LNA) 120, a bandpass filter (BPF) 130, a TX/RX switch 140, an antenna 150, a power amplifier (PA) 160, and a detector 170. The power amplifier 160 is configured to amplify a signal V from the signal-processing module 110 and provide an output signal $V_{OUT}$ to the TX/RX switch 140 and the detector 170. Thus, in a transmitting slot of the communication system 100, the TX/RX switch 140 is controlled to couple the power amplifier 160 and the antenna 150, such that the power amplifier 160 can transmit the output signal $V_{OUT}$ to the antenna 150 via the TX/RX switch 140. Furthermore, in a receiving slot of the communication system 100, the TX/RX switch 140 is controlled to couple the bandpass filter 130 and the antenna 150, such that the bandpass filter 130 can receive and filter a signal S1 from the antenna 150 via the TX/RX switch 140. Next, the bandpass filter 130 provides a signal S2 to the low noise amplifier 120 according to the signal S1. Thus, the low noise amplifier 120 provides a signal S3 to the signal-processing module 110 according to the signal S2. In the embodiment, the signal-processing module 110 is capable of executing radio frequency (RF) signal processes with related units, such as a mixer, a down converter or an up converter. Furthermore, the detector 170 detects the signal $V_{OUT}$ to provide the power information $P_{det}$ and the voltage information $V_{det}$ to the signal-processing module 110. According to the power information $P_{det}$ and the voltage information $V_{det}$, the signal-processing module 110 can obtain the impedance information of the antenna 150 and provide the signal V according to the impedance information of the antenna 150. In general, loading during the conductive measurement is 50 ohm. In one embodiment, a matching network between the power amplifier 160 and the TX/RX switch 140 is an option for converting 50 ohm to the lower impedance at an output terminal of the power amplifier 160. In another embodiment, the signal-processing module 110, the low noise amplifier 120, the bandpass filter 130, the TX/RX switch 140 and the power amplifier 160 are implemented in a chip. Furthermore, the signal-processing module 110 can obtain the loading variation according to the impedance information obtained at different time points. Thus, the transmission power of the communication system can be compensated according to the loading variation/impedance, as shown in Table 1.

TABLE 1

| Loading | TX Power Variation |
| --- | --- |
| 25 Ohm | +1 dB |
| 50 Ohm | 0 |
| 75 Ohm | −0.5 dB |
| 100 Ohm | −1 dB |

It is to be noted that Table 1 is an example and does not limit the invention, and the relationship between the loading and the TX power variation are determined according to various applications. Furthermore, the signal-processing module 110 can obtain the current information according to the power information and the voltage information, and the transmission power of the communication system can also be adjusted according to the current information.

Figure 2:
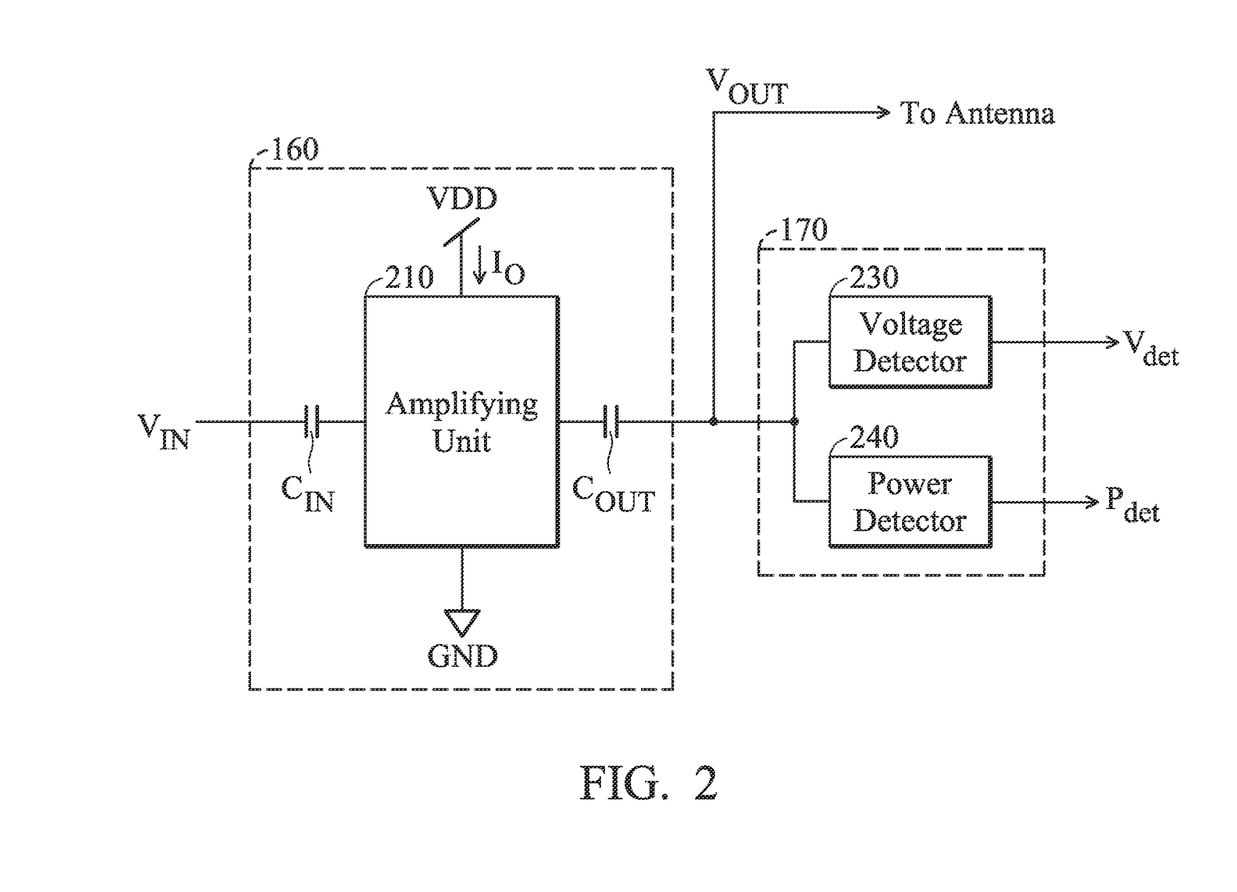
FIG. 2 shows the power amplifier and the detector of FIG. 1 according to an embodiment of the invention.

FIG. 2 shows an example illustrating the power amplifier 160 and the detector 170 of FIG. 1 according to an embodiment of the invention. Referring to FIG. 1 and FIG. 2, the power amplifier 160 comprises an amplifying unit 210, an input capacitor $C_{IN}$ and an output capacitor $C_{OUT}$. The input capacitor $C_{IN}$ is coupled between the signal-processing module 110 of FIG. 1 and the amplifying unit 210, wherein the input capacitor $C_{IN}$ is used to receive an input signal $V_{IN}$ from the signal-processing module 110. The output capacitor $C_{OUT}$ is coupled between the amplifying unit 210 and the detector 170, and the output signal $V_{OUT}$ is provided to the detector 170 and the TX/RX switch 140 of FIG. 1 via the output capacitor $C_{OUT}$. In the embodiment, the output signal $V_{OUT}$ is obtained according to the following equation:

$$V_{OUT} = I_O \times Z_L \tag{1}$$

where $I_O$ represents a current flowing through the amplifying unit 210, and $Z_L$ represents the loading impedance of the power amplifier 160. Furthermore, the detector 170 comprises a voltage detector 230 and a power detector 240. The voltage detector 230 is coupled to the output capacitor $C_{OUT}$, and the voltage detector 230 detects the output signal $V_{OUT}$ and provides the voltage information $V_{det}$ to the signal-processing module 110 of FIG. 1. Similarly, the power detector 240 is coupled to the output capacitor $C_{OUT}$, and the power detector 240 detects the output signal $V_{OUT}$ to provide the power information $P_{det}$ to the signal-processing module 110 of FIG. 1.

In FIG. 2, the power information $P_{det}$ is obtained by the power detector 240 according to the following equation (2):

$$P_{det} = K_1 \times V_{OUT} \times I_O \tag{2}$$

where $K_1$ represent a constant gain. Furthermore, the voltage information $V_{det}$ is obtained by the voltage detector 230 according to the following equation:

$$V_{det} = K_2 \times V_{OUT} \tag{3}$$

where $K_2$ also represent a constant gain. According to equation (1) and equation (3), equation (2) can be rewritten as the following equation (4):

$$P_{det} = K_1 \times \frac{V_{det}}{K_2} \times \frac{V_{OUT}}{Z_L} \tag{4}$$

$$= \frac{K_1}{K_2} \times V_{det} \times \frac{\frac{V_{det}}{K_2}}{Z_L}$$

$$= \frac{K_1}{K_2^2} \times \frac{V_{det}^2}{Z_L}.$$

Thus, the loading impedance $Z_L$ of the power amplifier 160 is obtained according to the following equation (5):

$$Z_L = K_1 \times \frac{V_{det}}{K_2} \times \frac{V_{OUT}}{Z_L} \tag{5}$$

$$= \frac{K_1}{K_2} \times V_{det} \times \frac{\frac{V_{det}}{K_2}}{Z_L}$$

$$= \frac{K_1}{K_2^2} \times \frac{V_{det}^2}{P_{det}},$$

where $K_1$ and $K_2$ are constant. Thus, according to the voltage information $V_{det}$ and the power information $P_{det}$, the signal-processing module 110 can obtain the loading impedance $Z_L$ of the power amplifier 160. Next, the signal-processing module 110 obtains a loading variation according to the loading impedance $Z_L$ and provides the input signal $V_{IN}$ according to the loading variation.

Figure 3:
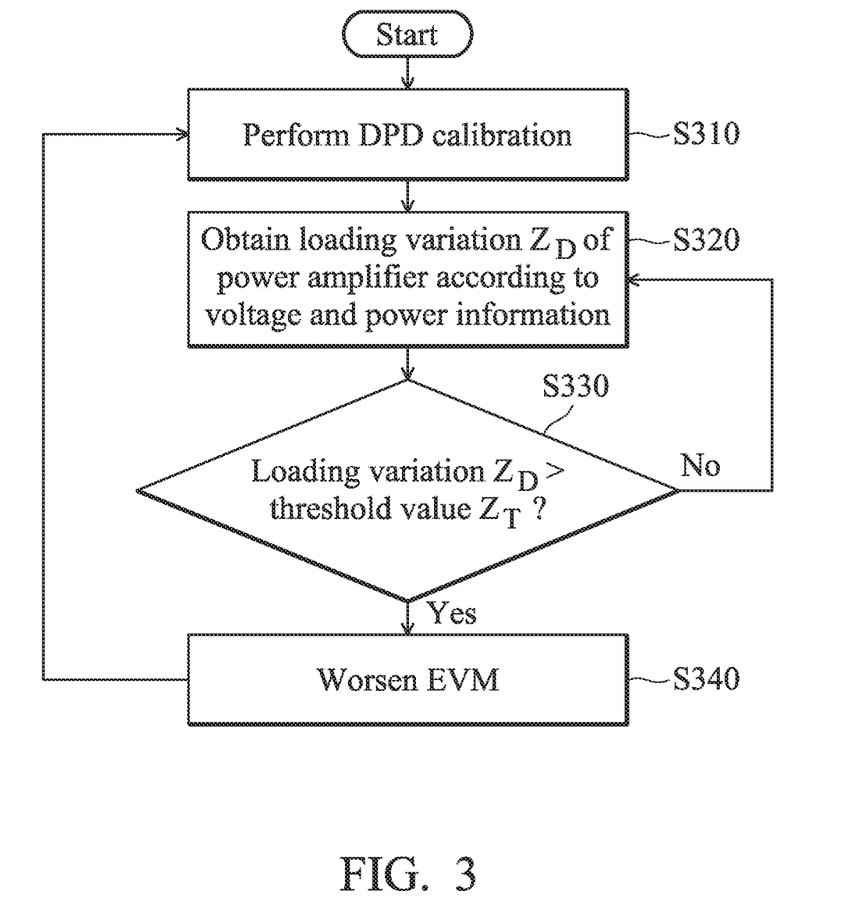
FIG. 3 shows a method for detecting a loading variation of a power amplifier according to an embodiment of the invention.

FIG. 3 shows a method for detecting a loading variation of a power amplifier according to an embodiment of the invention. Referring to FIG. 1 and FIG. 3 together, in step S310, a digital pre-distortion (DPD) calibration is performed by the signal-processing module 110 for an input signal $V_{IN}$. According to the input signal $V_{IN}$, the power amplifier 160 provides an output signal $V_{OUT}$. In response to the output signal $V_{OUT}$ from the power amplifier 160, the detector 170 provides the voltage information $V_{det}$ and the power information $P_{det}$ to the signal-processing module 110. Thus, according to equation (5), the signal-processing module 110 obtains the loading impedance $Z_{L1}$ of the power amplifier 160 when the DPD calibration is performed. Next, in step S320, after the DPD calibration is completed, the signal-processing module 110 computes the loading impedance $Z_{L2}$ of the power amplifier 160 according to the voltage information $V_{det}$ and the power information $P_{det}$ subsequently provided by the detector 170, and obtains a loading variation $Z_D$ according to the loading impedances $Z_{L1}$ and $Z_{L2}$ continuously. In step S330, the signal-processing module 110 determines whether the loading variation $Z_D$ exceeds a threshold value $Z_T$. If the loading variation $Z_D$ does not exceed the threshold value $Z_T$, the signal-processing module 110 computes the loading impedance $Z_{L2}$ of the power amplifier 160 according to the voltage information $V_{det}$ and the power information $P_{det}$ subsequently provided by the detector 170, and obtains the loading variation $Z_D$ according to the loading impedances $Z_{L1}$ and $Z_{L2}$ continuously (step S320). Conversely, if the loading variation $Z_D$ exceeds the threshold value $Z_T$, the signal-processing module 110 determines that the loading variation $Z_D$ will worsen an error vector magnitude (EVM) for the communication system 100 (step S340). Next, the DPD calibration is redone by the signal-processing module 110 to re-obtain the loading impedances $Z_{L1}$ (step S310). In one embodiment, an initial DPD calibration is performed after the communication system 100 is powered on.

Figure 4:
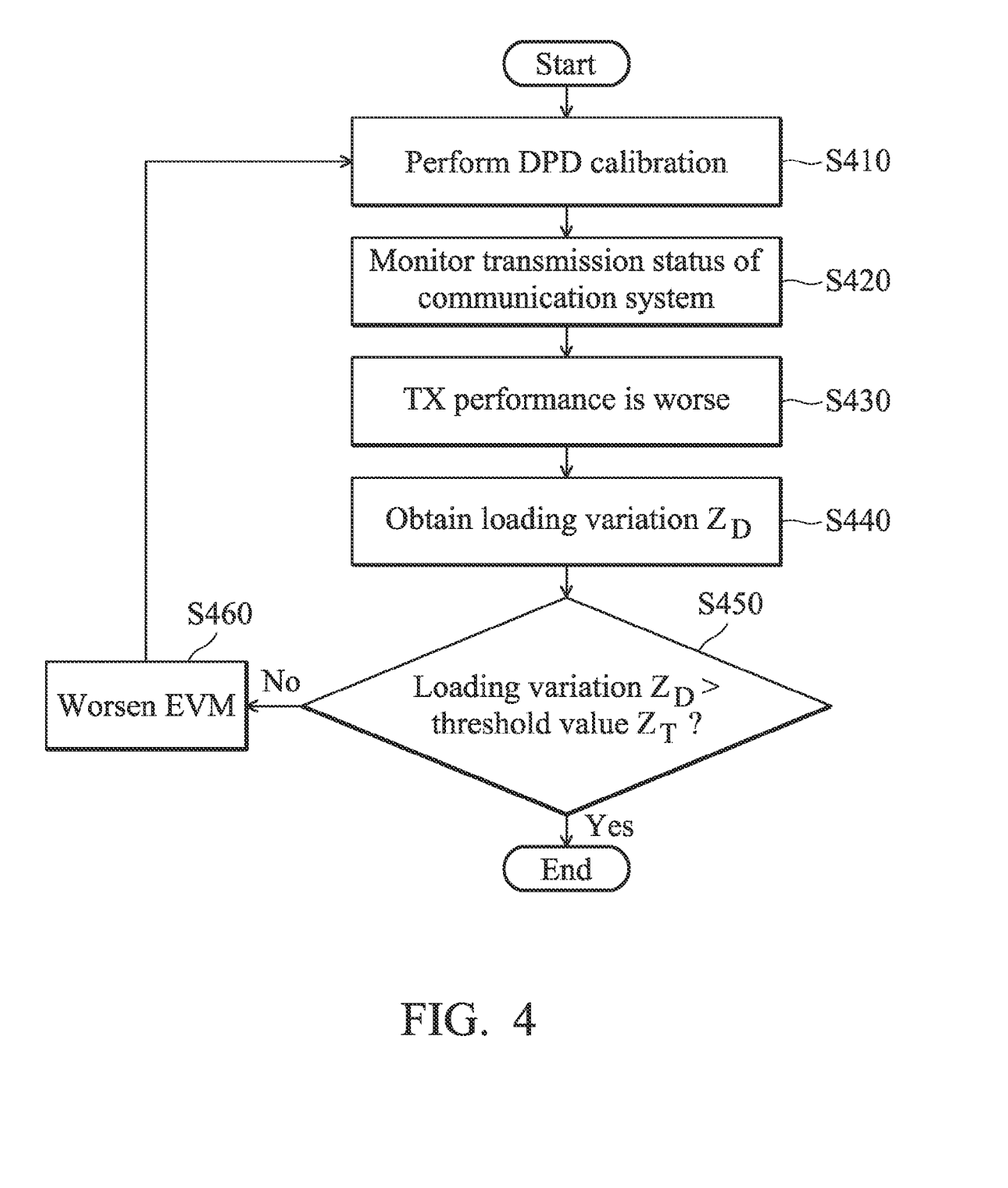
FIG. 4 shows a method for detecting a loading variation of a power amplifier according to another embodiment of the invention.

FIG. 4 shows a method for detecting a loading variation of a power amplifier according to another embodiment of the invention. Referring to FIG. 1 and FIG. 4 together, in step S410, a digital pre-distortion (DPD) calibration is performed by the signal-processing module 110 for an input signal $V_L$. According to the input signal $V_{IN}$, the power amplifier 160 provides an output signal $V_{OUT}$. In response to the output signal $V_{OUT}$ from the power amplifier 160, the detector 170 provides the voltage information $V_{det}$ and the power information $P_{det}$ to the signal-processing module 110. Thus, according to the equation (5), the signal-processing module 110 obtains the loading impedance $Z_{L1}$ of the power amplifier 160 when the DPD calibration is performed. Next, in step S420, the transmission status of the communication system 100 is monitored by a processor of the communication system 100. Next, in step S430, when it is monitored that the transmission status indicates transmission performance is worse, the signal-processing module 110 computes the loading impedance $Z_{L2}$ of the power amplifier 160 according to the voltage information $V_{det}$ and the power information $P_{det}$, wherein the detector 170 obtains the voltage information $V_{det}$ and the power information $P_{det}$ when the transmission performance is worse. In one embodiment, the communication system 100 is a mobile station camping on a cell via the antenna 150, and the processor of the communication system 100 may determine that the transmission performance is worse when no response from the cell is received by the signal-processing module 110 via the antenna 150. In another embodiment, the processor of the communication system 100 may determine that the transmission performance is worse when the bit error ratio (BER) of the signal received by the signal-processing module 110 from the cell via the antenna 150 exceeds a specific ratio. Next, in step S440, the signal-processing module 110 obtains a loading variation $Z_D$ according to the loading impedances $Z_{L1}$ and $Z_L$. In step S450, the signal-processing module 110 determines whether the loading variation $Z_D$ exceeds a threshold value $Z_T$. If the loading variation $Z_D$ does not exceed the threshold value $Z_T$, the signal-processing module 110 determines that the worse transmission performance is not caused by the loading variation $Z_D$ for the communication system 100. Conversely, if the loading variation $Z_D$ exceeds the threshold value $Z_T$, the signal-processing module 110 determines that the loading variation $Z_D$ will worsen an error vector magnitude (EVM) for the communication system 100 (step S460). Next, the DPD calibration is redone by the signal-processing module 110 to re-obtain the loading imped-ance $Z_{L1}$ (step S410). In one embodiment, an initial DPD calibration is performed after the communication system 100 is powered on.

Figure 5:
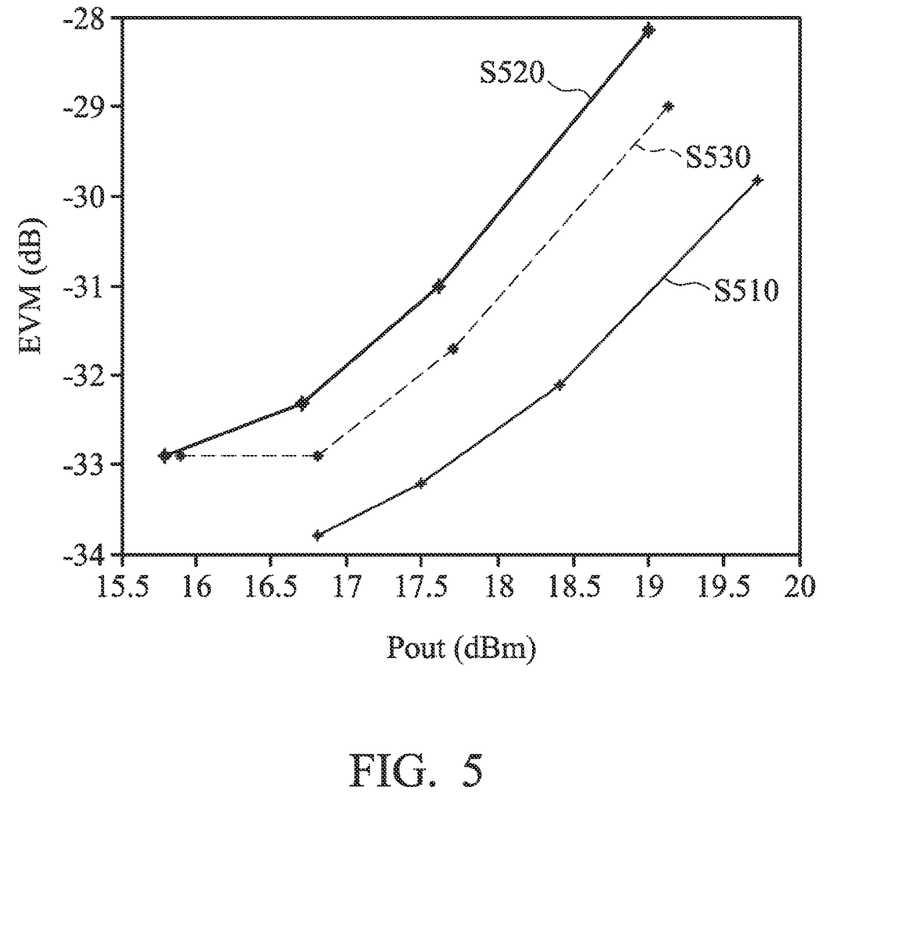
FIG. 5 shows a diagram illustrating non-ideal effects of input power amplitude modulation (AM) to output power phase modulation (PM) for various conditions according to an embodiment of the invention.

FIG. 5 shows a diagram illustrating non-ideal effects of input power amplitude modulation (AM) to output power phase modulation (PM) for various conditions according to an embodiment of the invention. In FIG. 5, curve S510 represents the AM-PM curve of an initial DPD calibration, wherein the initial DPD calibration is performed after a communication system is powered on. Curve S520 represents the AM-PM curve of a larger loading variation that will cause a worse transmission performance. As described above, when the larger loading variation exceeds the threshold value $Z_T$, a new DPD calibration is performed. Therefore, a better error vector magnitude is obtained, as shown in curve S530.

Figure 6:
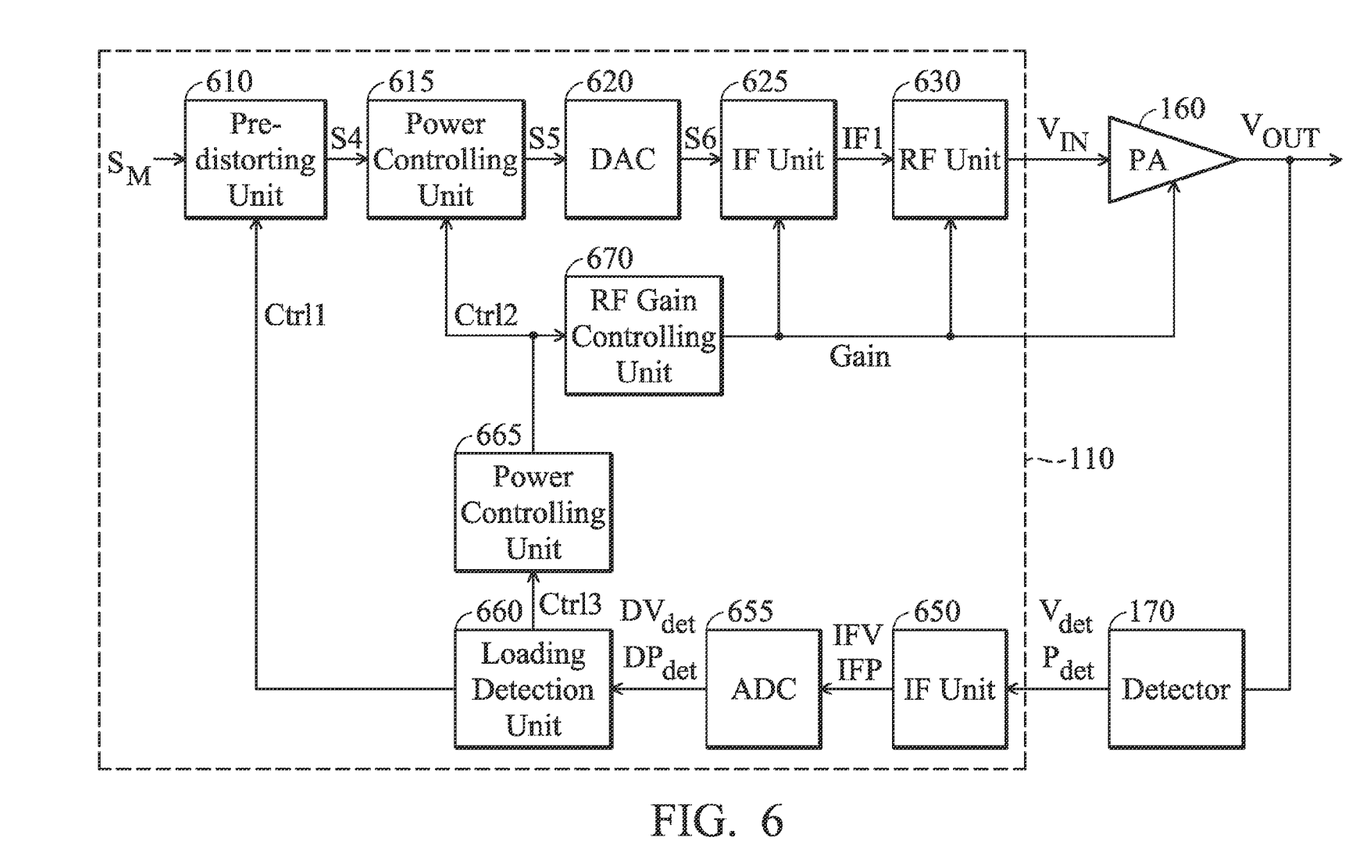
FIG. 6 shows a diagram illustrating the signal-processing module of FIG. 1 according to an embodiment of the invention.

FIG. 6 shows a diagram illustrating the signal-processing module 110 of FIG. 1 according to an embodiment of the invention. The signal-processing module 110 comprises a pre-distorting unit 610, a power controlling unit 615, a digital to analog converter 620, an intermediate frequency (IF) unit 625, a radio frequency (RF) unit, an IF unit 650, an analog to digital converter (ADC) 655, a loading detection unit 660, a power controlling unit 665 and a RF gain controlling unit 670. The pre-distorting unit 610 receives a modulation signal $S_M$, and performs a digital pre-distortion calibration to obtain a signal S4 according to a control signal Ctrl1 from the loading detection unit 660. The power controlling unit 615 controls the power energy of the signal S4 to obtain a signal S5 according to a control signal Ctrl2. The DAC 620 converts the signal S5 to obtain a signal S6. The IF unit 625 mixes the signal S6 and amplifies the mixed signal S6 according to a control signal Gain, to obtain an IF signal IF1. The RF unit 630 mixes the IF signal IF1 and amplifies the mixed signal IF1 according to the control signal Gain, to obtain the RF signal $V_{IN}$. Next, the power amplifier 160 amplifies the signal $V_{IN}$ to obtain the output signal $V_{OUT}$ according to the control signal Gain. Next, the detector 170 detects the signal $V_{OUT}$, to provide the signal $P_{det}$ and the signal $V_{det}$ to the RF unit 650 of the signal-processing module 110. The IF unit 650 mixes the signal $V_{det}$ to obtain an IF signal IFV. Furthermore, the IF unit 650 also mixes the signal $P_{det}$ to obtain an IF signal IFP. Next, the ADC 655 converts the signals IFV and IFP into the signals $DV_{det}$ and $DP_{det}$, respectively. Next, the loading detection unit 660 receives the signal $DV_{det}$ corresponding to the voltage information $V_{det}$ and the signal $DP_{det}$ corresponding to the power information $P_{det}$, and then obtains the loading impedance $Z_L$ of the power amplifier 160 according to the equation (5). Next, the loading detection unit 660 provides the control signal Ctrl1 to the pre-distorting unit 610 according to the loading impedance $Z_L$, so as to re-do calibration for loading variation. Furthermore, the loading detection unit 660 also provides the control signal Ctrl3 to the power controlling unit 665 according to the loading impedance $Z_L$. Next, the power controlling unit 665 provides the control signal Ctrl2 according to the control signal Ctrl3, so as to perform power control for the loading variation $Z_D$. Thus, the power controlling unit 615 can adjust the power energy of the signal S4 to obtain the signal S5 according to the control signal Ctrl2. Furthermore, the RF gain controlling unit 670 generates the control signal Gain according to the control signal Ctrl2, so as to reduce transmission power for current protection.

Figure 7:
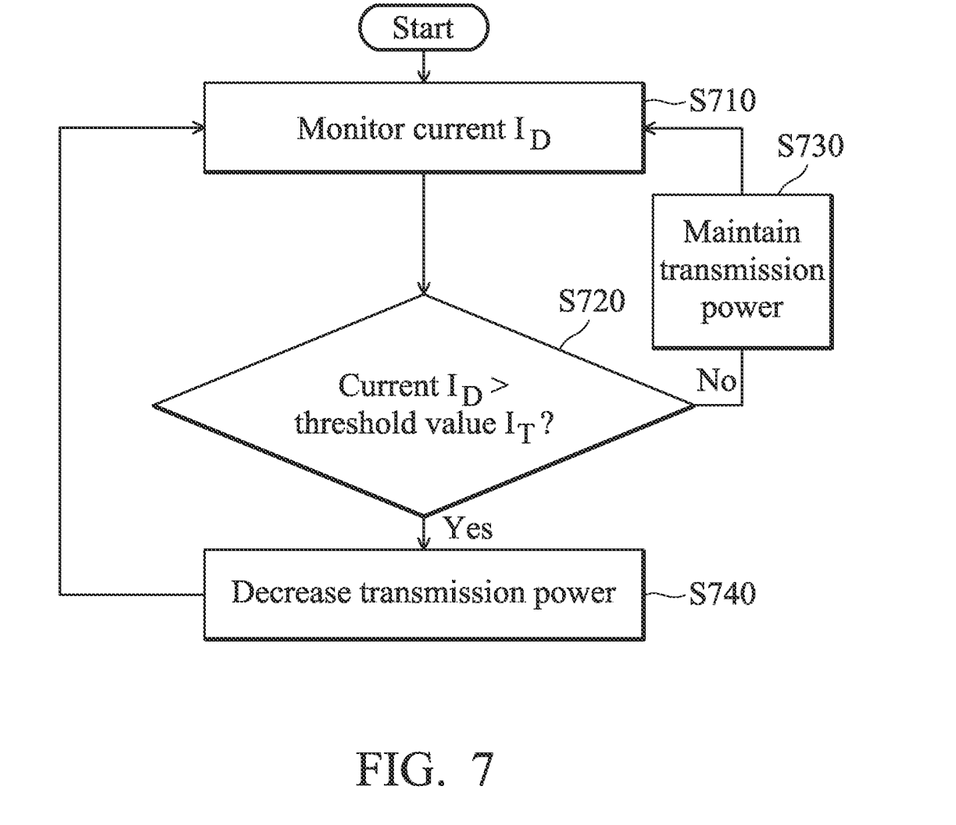
FIG. 7 shows a method for detecting a loading variation of a power amplifier according to another embodiment of the invention.

FIG. 7 shows a method for detecting current information of a power amplifier according to an embodiment of the invention. Referring to FIG. 6 and FIG. 7 together, in step S710, the signal $DV_{det}$ corresponding to the voltage information $V_{det}$ and the signal $DP_{det}$ corresponding to the power information $P_{det}$ are obtained by the loading detection unit 660, so as to monitor/poll the current $I_D$ of the power amplifier 160 continuously. Thus, the current $I_D$ of the power amplifier 160 is obtained according to the following equation (6):

$$I_D = \frac{P_{det}}{V_{det}} \times \frac{K_2}{K_1}. \tag{6}$$

In step S720, the loading detection unit 660 determines whether the current $I_D$ exceeds the threshold value $I_T$. If the current $I_D$ does not exceed the threshold value $I_T$, the loading detection unit 660 maintains the control signals Ctrl1 and Ctrl3, such that the transmission power of the communication system 100 is normal (step S730). Conversely, if the current $I_D$ exceeds the threshold value $Z_T$, the loading detection unit 660 adjusts the control signals Ctrl1 and Ctrl3, so as to decrease be transmission power of the communication system 100 for current protection of the communication system 100 (step S740).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication system, comprising:
an antenna;
a power amplifier, providing an output signal to the antenna according to an input signal;
a detector, providing power information and voltage information according to the output signal; and
a signal-processing module, obtaining a loading variation according to the power information and the voltage information, and providing the input signal according to the loading variation,
wherein when the loading variation exceeds a threshold value, the signal-processing module performs a digital pre-distortion calibration for the input signal.

2. The communication system as claimed in claim 1, wherein the signal-processing module obtains a first loading impedance according to the power information and the voltage information, and the loading variation is a difference between the first loading impedance and a second loading impedance corresponding to a previous digital pre-distortion calibration.

3. The communication system as claimed in claim 1, wherein a transmission power of the communication system is compensated according to the loading variation.

4. The communication system as claimed in claim 1, wherein current information is obtained according to the power information and the voltage information, and a transmission power of the communication system is adjusted according to the current information, wherein the transmission power of the communication system is decreased when the obtained current information exceeds a threshold value.

5. A method for detecting a loading variation of a power amplifier, comprising:
performing a first digital pre-distortion calibration for an input signal of the power amplifier;
obtaining a first loading impedance of the power amplifier when the first digital pre-distortion calibration is performed;
obtaining first power information and first voltage information according to an output signal of the power amplifier by a detector after the first loading impedance of the power amplifier is obtained;
obtaining a second loading impedance of the power amplifier according to the first power information and the first voltage information; and
obtaining a loading variation of the power amplifier according to the first loading impedance and the second loading impedance.

6. The method as claimed in claim 5, further comprising:
performing a second digital pre-distortion calibration for the input signal of the power amplifier when the loading variation exceeds a threshold value.

7. The method as claimed in claim 5, wherein the step of obtaining the first loading impedance of the power amplifier further comprises:
obtaining second power information and second voltage information when the first digital pre-distortion calibration is performed; and
obtaining the first loading impedance of the power amplifier according to the second power information and the second voltage information.

8. The method as claimed in claim 5, wherein the loading variation is a difference between the first loading impedance and the second loading impedance.

9. The method as claimed in claim 5, wherein the power amplifier and the detector are implemented in a communication system, and a transmission power of the communication system is compensated according to the loading variation.

10. The method as claimed in claim 5, further comprising:
obtaining current information according to the first power information and the first voltage information,
wherein a transmission power of the communication system is adjusted according to the current information,
wherein the transmission power of the communication system is decreased when the obtained current information exceeds a threshold value.

11. The method as claimed in claim 5, further comprising:
monitoring the loading variation of the power amplifier; and
controlling a transmission power of the communication system according to the monitored loading variation.

12. A method for detecting a loading variation of a power amplifier, wherein the power amplifier is implemented in a communication system, comprising:
performing a first digital pre-distortion calibration for an input signal of the power amplifier;
obtaining a first loading impedance of the power amplifier when the first digital pre-distortion calibration is performed;
monitoring a transmission status of the communication system;
obtaining first power information and first voltage information according to an output signal of the power amplifier by a detector when the transmission status indicates that a transmission performance is worse;
obtaining a second loading impedance of the power amplifier according to the first power information and the first voltage information; and
obtaining a loading variation of the power amplifier according to the first loading impedance and the second loading impedance.

13. The method as claimed in claim 12, further comprising:
performing a second digital pre-distortion calibration for the input signal of the power amplifier when the loading variation exceeds a threshold value.

14. The method as claimed in claim 12, wherein the step of obtaining the first loading impedance of the power amplifier further comprises:
   obtaining second power information and second voltage information when the first digital pre-distortion calibration is performed; and
   obtaining the first loading impedance of the power amplifier according to the second power information and the second voltage information.

15. The method as claimed in claim 12, wherein the loading variation is a difference between the first loading impedance and the second loading impedance.

16. The method as claimed in claim 12, wherein a transmission power of the communication system is compensated in response to the loading variation.

17. The method as claimed in claim 12, further comprising:
   obtaining current information according to the first power information and the first voltage information,
   wherein a transmission power of the communication system is adjusted according to the current information,
   wherein the transmission power of the communication system is decreased when the obtained current information exceeds a threshold value.

18. The method as claimed in claim 12, further comprising:
   monitoring the loading variation of the power amplifier; and
   controlling a transmission power of the communication system according to the monitored loading variation.

* * * * *